United States Patent
Krutsick

(10) Patent No.: US 7,821,016 B2
(45) Date of Patent: Oct. 26, 2010

(54) LIGHT ACTIVATED SILICON CONTROLLED SWITCH

(75) Inventor: Thomas Joseph Krutsick, Fleetwood, PA (US)

(73) Assignee: Zarlink Semiconductor (U.S.) Inc., Austin, TX (US)

(*) Notice: Subject to any disclaimer, the term of this patent is extended or adjusted under 35 U.S.C. 154(b) by 238 days.

(21) Appl. No.: 12/061,085

(22) Filed: Apr. 2, 2008

(65) Prior Publication Data

US 2009/0250706 A1 Oct. 8, 2009

(51) Int. Cl.
*H01L 27/15* (2006.01)

(52) U.S. Cl. .................. 257/80; 257/115; 257/E27.127

(58) Field of Classification Search ......... 257/113–118, 257/80
See application file for complete search history.

(56) References Cited

U.S. PATENT DOCUMENTS 7,605,010 B1 * 10/2009 Krutsick ...................... 438/22
2009/0230476 A1 * 9/2009 Krutsick ..................... 257/360

* cited by examiner

*Primary Examiner*—Dung A. Le
(74) *Attorney, Agent, or Firm*—Williams, Morgan & Amerson

(57) ABSTRACT

The present invention provides an optically triggered switch and a method of forming the optically triggered switch. The optically triggered switch includes a silicon layer having at least one trench formed therein and at least one silicon diode formed in the silicon layer. The switch also includes a first thyristor formed in the silicon layer. The first thyristor is physically and electrically isolated from the silicon diode by the trench and the first thyristor is configured to turn on in response to electromagnetic radiation generated by the silicon diode.

10 Claims, 3 Drawing Sheets

LIGHT ACTIVATED SILICON CONTROLLED SWITCH

CROSS REFERENCE TO RELATED APPLICATIONS

This application is related to U.S. application Ser. No. 12/046,642, filed Mar. 12, 2008, entitled "A PROTECTION CIRCUIT FOR A SUBSCRIBER LINE INTERFACE CIRCUIT" by Christopher J. Speyer. This application is also related to U.S. application Ser. No. 12/046,683 filed Mar. 12, 2008, entitled "AN OPTICALLY TRIGGERED ELECTROSTATIC DISCHARGE PROTECTION CIRCUIT by Thomas J. Krutsick."

BACKGROUND OF THE INVENTION

1. Field of the Invention

This invention relates generally to switching devices formed in silicon, and, more particularly, to a light activated, silicon controlled switch.

2. Description of the Related Art

A thyristor is a semiconductor switch whose bistable action depends on p-n-p-n structure regenerative feedback. Thyristors can take many forms but in general they are solid-state switches that act is open circuits capable of withstanding a rated voltage until they are triggered. When the thyristor is triggered it becomes a low impedance current path and remains in that condition until the current stops or drops below the minimum value called a holding level. Once the thyristor has been triggered, the trigger current can be removed without turning off the device. Silicon controlled rectifiers and triacs are both members of the thyristor family. Structurally, thyristors consist of alternating layers of opposite p-type and n-type silicon. For example, the simplest thyristor design includes four layers including two p-type layers that alternate with two n-type silicon layers.

Thyristors are typically triggered by applying a current to one or more elements in the thyristor. For example, a control circuit may be used to supply a trigger current to the thyristor when some condition enforced by the control circuit is satisfied. The critical current required to trigger the thyristor is typically called the latching current. In some cases, the control circuit provides the trigger current in response to an optical signal generated by an optical source. The optical source is typically an external source that is constructed of a compound semiconductor, while the receiver is silicon.

The present invention is directed to addressing the effects of one or more of the problems set forth above.

SUMMARY OF THE INVENTION

The following presents a simplified summary of the disclosed subject matter in order to provide a basic understanding of some aspects of the disclosure. This summary is not an exhaustive overview of the invention. It is not intended to identify key or critical elements of the invention or to delineate the scope of the disclosed subject matter. Its sole purpose is to present some concepts in a simplified form as a prelude to the more detailed description that is discussed later.

In various embodiments, an optically triggered switch and a method of forming the optically triggered switch are provided. One embodiment of the optically triggered switch includes a silicon layer having at least one trench formed therein and at least one silicon diode formed in the silicon layer. The switch also includes a first thyristor formed in the silicon layer. The first thyristor is physically and electrically isolated from the silicon diode by the trench and the first thyristor is configured to turn on in response to electromagnetic radiation generated by the silicon diode.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
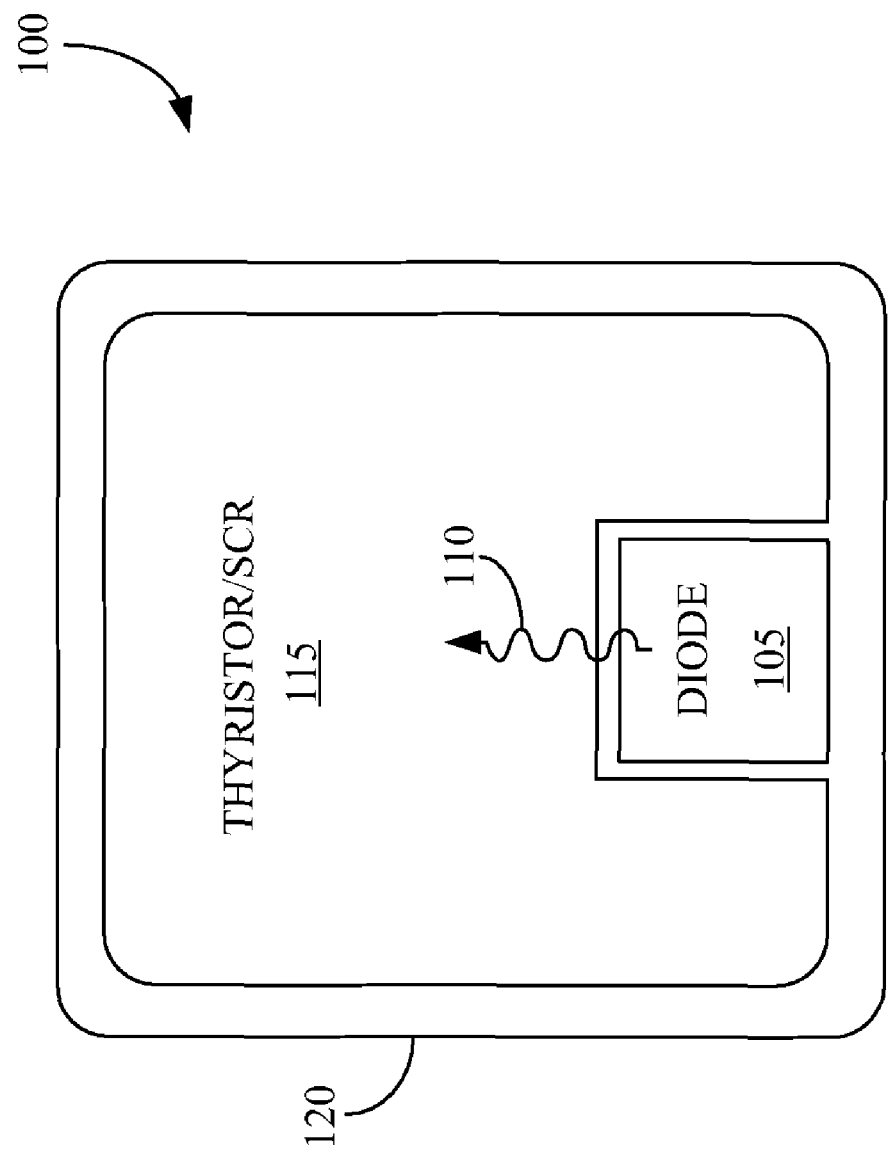
FIG. 1 conceptually illustrates a first exemplary embodiment of a light activated, silicon controlled switch.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the discussion with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates a first exemplary embodiment of a light activated, silicon controlled switch 100. In the illustrated embodiment, the light activated, silicon controlled switch 100 includes a silicon diode 105 that may be formed in a silicon layer deposited over a substrate. Silicon diodes 105 of these types may be incorporated into the design of a device or system for use in silicon integrated circuits, as discussed herein. In various embodiments, the silicon diode 105 may generate electromagnetic radiation 110 by various processes depending on the structure of the silicon diode 105. For example, a simple p-n junction diode may be used as an emitter of optical and near infrared photons. Other examples of silicon diodes 105 that may be implemented in the switch 100 include diodes formed using porous silicon, engineered defects, hybrid (doped) materials, anti-fuses, and/or nanocrystal designs.

The silicon diode 105 integrated into a silicon integrated circuit may generate photons by several physical mechanisms. Examples include generation of high energy photons by hole-electron recombination/annihilation, generation of 1050 nm wavelength photons by interband emission from forward biasing the diode 105, generation of 650 nm photons by intraband emission due to avalanche or reverse biasing the diode 105, bremsstrahlung radiation, thermal generation of IR-to-visible wavelength photons, and intermittent generation of photons by the spark gap phenomena. Thus, in various embodiments, the p-n junction diode 105 may be operated in forward bias or in reverse breakdown (avalanche mode) to get the required emissions. Thermal emission may also be generated when a lot of current passes through the junction and heats up the local area. However, persons of ordinary skill in the art having benefit of the present disclosure should appreciate that the particular physical mechanisms described herein are meant to be illustrative and not to limit the disclosed subject matter to the particular mechanisms for generating electromagnetic radiation using the silicon diode 105.

The switch 100 also includes a thyristor 115 that is formed above the same substrate that includes the silicon diode 105. Although a thyristor 115 is shown in FIG. 1, persons of ordinary skill in the art having benefit of the present disclosure should appreciate that the term "thyristor" refers to a semiconductor switch whose bistable action depends on p-n-p-n structure regenerative feedback. This term therefore encompasses devices including, but not limited to, silicon controlled rectifiers (SCRs) or reverse-blocking triode thyristors (which have 3 terminals—an anode, a cathode, and a control electrode/gate), reverse conducting thyristors, Shockley diodes (which include a p-n-p-n diode without the control electrode), gate turn off devices, and light activated SCRs. In the illustrated embodiment, the thyristor 115 and the silicon diode 105 are physically and electrically isolated by a portion of a trench 120, which may be formed in the layer or layers that include the material used to form the diode 105 and the thyristor 115.

The diode 105, thyristor 115, and/or trench 120 may be formed so that electromagnetic radiation 110 generated by the silicon diode 105 can trigger the thyristor 115 to enter the conductive or ON state. For example, parameters such as the intensity of the electromagnetic radiation 110 generated by the diode 105, the turn on or latching current for the thyristor 115, the thickness and/or optical thickness of the trench 120, and the like may be selected so that the diode 105 is optically coupled to the thyristor 115. In the conductive state, the thyristor 115 allows current to flow through the thyristor 115. In one embodiment, electron-whole pairs are generated when the electromagnetic radiation 110 impinges upon the thyristor 115. When the thyristor 115 is in the forward blocking condition or state, exposing it to electromagnetic radiation 110 or other carrier-generating radiation increases the magnitude of the generation-recombination current in the thyristor 115. The generation-recombination current may then trigger the thyristor 115 to enter the conductive or ON state in a manner similar to the effect of the presence of a high saturation current in the thyristor 115.

Although the diode 105 shown in FIG. 1 is formed proximate one edge of the trench 120, this is not required for all embodiments. Alternatively, the diode 105 may be formed so that it is completely surrounded by the thyristor 115. This alternate configuration may have some advantages over other designs. For example, end effects may be reduced by placing the diode 105 within the thyristor 115. Furthermore, the thyristor 115 may also catch more of the emissions from the diode 105 if the diode 105 is formed in the center of the thyristor 115.

Figure 2:
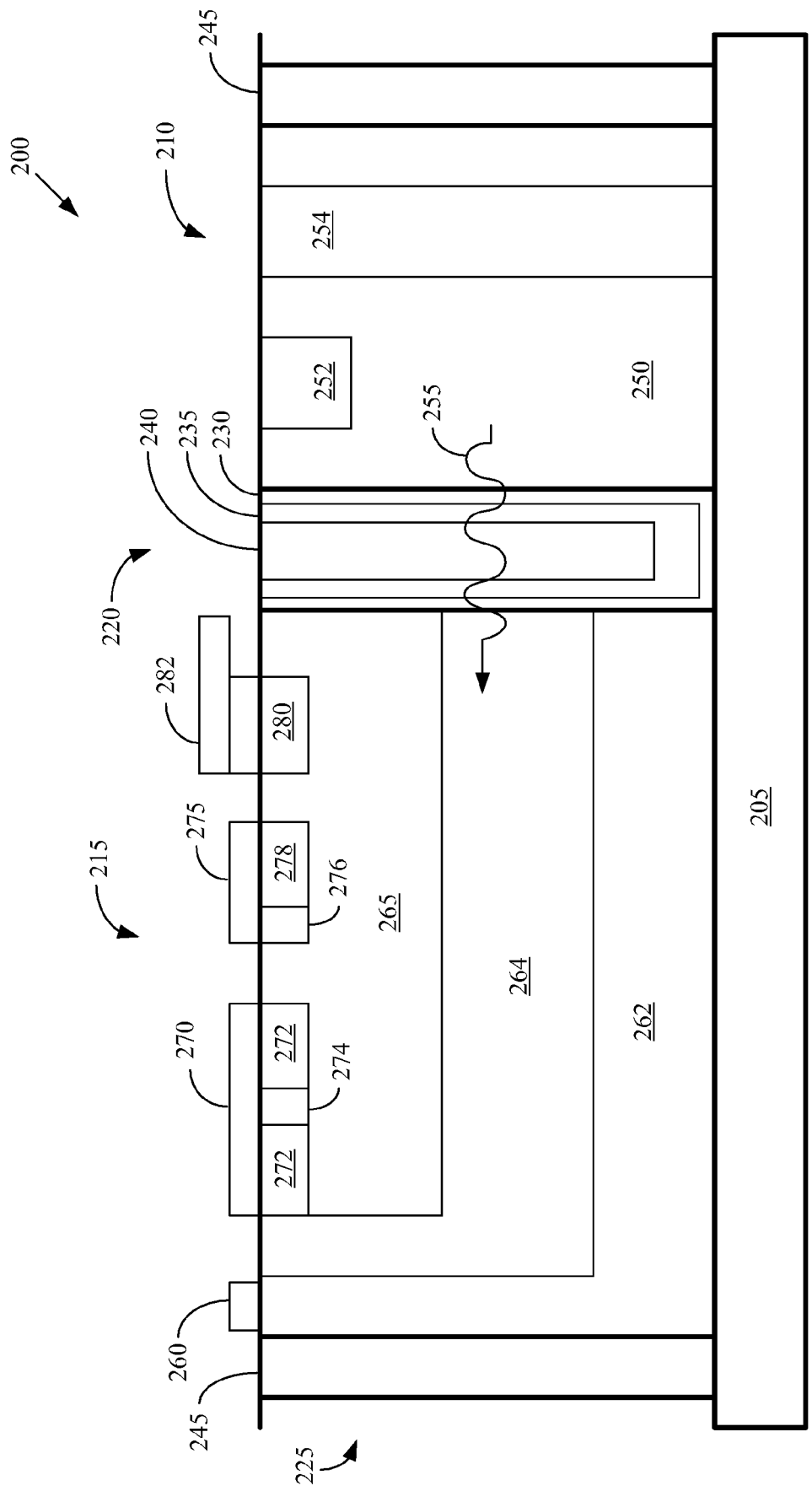
FIG. 2 conceptually illustrates a second exemplary embodiment of a light activated, silicon controlled switch.

FIG. 2 conceptually illustrates a second exemplary embodiment of a light activated, silicon controlled switch 200. In the illustrated embodiment, the switch 200 is formed over a substrate 205. The substrate 205 may be a portion of a silicon wafer or it may include other layers formed in, on, over, and/or adjacent the silicon wafer. For example, the substrate 205 may be a silicon-on-insulator (SOI) substrate. Silicon-on-insulator (SOI) devices may be characterized by having a thin layer of insulating dielectric material (for example, a buried oxide or nitride or other suitable insulating layer) sandwiched between a bulk semiconductor substrate and the circuit elements of the device. Typically, no other layers of material are interposed between the buried dielectric layer and the bulk substrate although the disclosed subject matter is not limited to this structure. In a silicon-on-insulator (SOI) device, the circuit elements above the buried dielectric layer are established in regions of a thin film of substantially monocrystalline semiconductor layer, often bonded and/or grown epitaxially, that are separated from each other by insulating dielectric regions (of field oxide, for example). The (epitaxial) semiconductor layer may be n-doped or p-doped as appropriate with N-type or P-type conductivity dopants. For example, the (epitaxial) semiconductor layer may include a body region having a P-type dopant, the body region being disposed between source/drain regions.

In the illustrated embodiment, the switch 200 includes a silicon diode 210 and a thyristor 215 that are separated by a trench 220. The elements 210, 215, 220 shown in FIG. 2 are formed in a silicon layer 225. The trench 220 includes an oxide layer 230 and a nitride layer 235, although other layers may also be included in other embodiments. Alternatively, the trench 220 may only include the oxide layer 230. A polysilicon fill 240 may also be formed in the trench 220. For example, the silicon layer 225 may be etched to form the trench 220 and then a dielectric (or stack of dielectrics) can be deposited on the walls of the trench 220. The poly fill 240, which may be doped or undoped, is used to fill the remaining opening in the trench 220. Persons of ordinary skill in the art having benefit of the present disclosure should appreciate that the embodiment depicted in FIG. 2 is intended to be illustrative and not to limit the disclosed subject matter. In alternative embodiments, additional layers or elements may be formed using additional processing steps known to persons of ordinary skill in the art. The switch 200 also includes additional trenches 245, which may have the same structure as the trench 220 or may have a different structure.

The silicon diode 210 is formed in an n-type region 250, which can be formed by doping a portion of the silicon layer 225 with an n-type dopant. For example, n-type material may be deposited over the substrate 205. The n-type material may be an n-type epitaxial layer or arsenic doped as it is deposited. A small buried n layer may be formed at the bottom of the diode 210 (i.e., near the substrate 205). By applying a relatively high temperature for a relatively long diffusion time, the buried layer may be diffused out to cover the whole bottom of the diode 210. In this case, the n-type region 250 has a relatively high concentration of dopants near the substrate 205 and a relatively lower concentration of dopants near the top of the diode 210. However, persons of ordinary skill in the art having benefit of the present disclosure should appreciate that other techniques for forming the n-type region 250 may be used. The silicon diode 210 also includes a p-type region 252 and an n-type region 254 that is more highly doped than the n-type region 250. Techniques for forming the regions 250, 252, 254, such as dopant implantation/diffusion and/or epitaxy, are known in the art and in the interest of clarity will not be discussed further herein. Furthermore, persons of ordinary skill in the art having benefit of the present disclosure should appreciate that the disclosed subject matter is not limited to this particular structure for the silicon diode 220 or this particular polarity for the region 250, 252, 254. In alternative embodiments, other structures and/or the opposite polarity may be used, e.g., n-type and p-type may be reversed. Contacts (not shown in FIG. 2) to the regions 252, 254 may be used to bias the silicon diode 210 so that the diode 210 generates electromagnetic radiation 255.

The thyristor 215 includes an anode contact 260 that is used to contact an anode region 262 in the thyristor 215. In the illustrated embodiment, the anode region 262 is a p-type region (which may also be referred to as a tub or a well) that may be formed using known implantation and/or epitaxy techniques. An epitaxial (EPI) region 264 is then formed within the anode region 262. In one embodiment that uses a silicon-on-insulator substrate 205, the process starts with an SOI substrate that includes a thin silicon layer on top of a buried oxide, which is on top of a thick handle wafer (used only for support). The buried layers are implanted in the thin silicon layer to form the horizontal portion of the anode region 262 and then an n-type epi layer 264 is grown on top of the buried layer 262. A sinker is formed from the surface down to the buried layer 262. The sinker is implanted and diffused to form the vertical portion of the anode region 262. The thyristor 215 also includes a base region 265 that is a p-type region that is formed within the EPI region using known implantation/diffusion techniques. When the thyristor 215 is in its forward blocking mode, most of the reverse bias is supported in the EPI region 264. Persons of ordinary skill in the art having benefit of the present disclosure should appreciate that the disclosed subject matter is not limited to this particular structure for the thyristor 215 or this particular polarity for the regions 262, 264, 265. In alternative embodiments, other structures and/or the opposite polarity may be used, e.g., n-type and p-type may be reversed.

A cathode contact 270 is used to contact a primary portion of the thyristor 215. The primary portion includes n-type regions 272 that are formed in the base region 265 and contact the cathode contact 270. The primary portion may also include a cathode short 274 that is a p-type region 274 formed in the base region 265 so that it contacts the cathode contact 270. The thyristor 215 also includes an amplifying gate 275 that is formed in contact with a p-type region 276 and an n-type region 278. An additional thyristor element (referred to herein as a turn on thyristor or SCR) may be formed in the base region 265 by implanting an n-type region 280 in the base region 265. In the illustrated embodiment, the n-type region 280 is contacted by a contact 282. Alternatively, a contact to the p-type region 265 can also be included on this turn on SCR 282. The overhang of the poly shown in FIG. 2 may be configured to reflect radiation from the diode 210 back into the thyristor 215.

Persons of ordinary skill in the art having benefit of the present disclosure should appreciate that the particular combination of cathode shorts 274 and amplifying gates 275 (including the region 276) are intended to be illustrative. However, alternative embodiments of the thyristor 215 may implement other combinations of elements that may include more or fewer cathode shorts 274, as well as more or fewer amplifying gates 275. Furthermore, in alternative embodiments other structures may be used for the amplifying gate 275, the region 276 and/or the region 278. For example, the amplifying gate 275 may be in direct contact with the layer 265.

In operation, the silicon diode 210 generates electromagnetic radiation 255 that passes through the trench 220 and into the thyristor 215. The electromagnetic radiation 255 generates electron-hole pairs (ehps) in the EPI region 264 and/or the base region 265. The electron-hole pairs form a photogenerated current in the thyristor 215. This current flows to the periodic cathode shorts 274, 276 producing a voltage drop under the n+ region 280 in the turn-on thyristor, which includes the layers 262, 264, 265, 280. The voltage drop generated by the photo-generated current forward biases the N+ emitter 280 of the n-p-n portion of the turn-on thyristor. If the bias is sufficiently large, the turn on thyristor is triggered into its conductive or ON state, which generates additional current in the thyristor 215. This current also flows to the cathode shorts 274, 276 and generates a voltage drop that forward biases the N+ emitter 278 of the amplifying gate 275, which turns on this thyristor region formed of the layers 262, 264, 265, 278. Since no connection is made to the amplifying gate 275, this current also flows to the cathode shorts 274, 276. As the total anode current in the amplifying region increases, the forward bias of the n+ emitter 272 of the main thyristor (formed of the layers 262, 264, 265, 272) increases and begins to inject electrons, eventually turning on the thyristor 215 when the anode current reaches the threshold or latching current.

Figure 3:
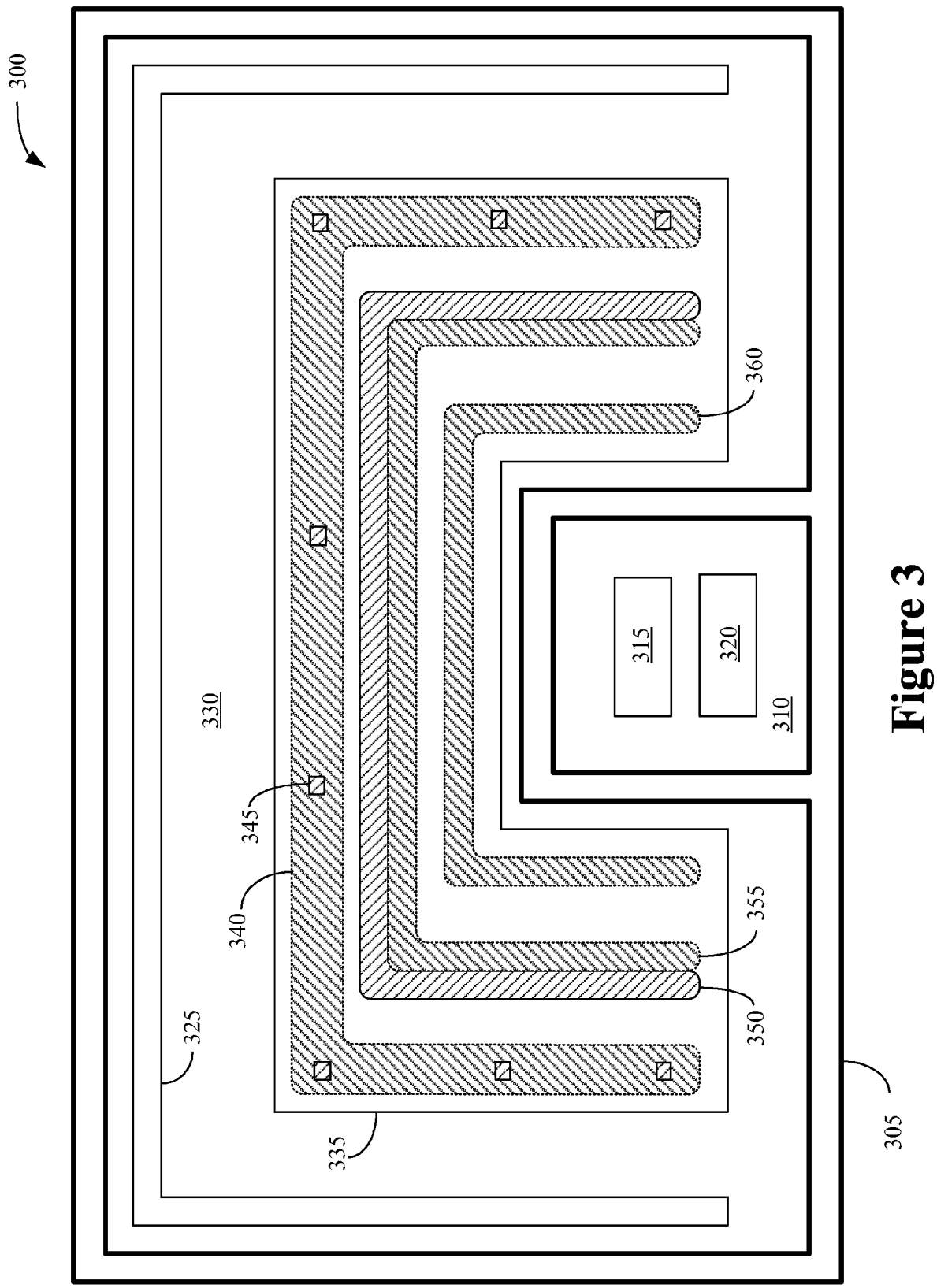
FIG. 3 conceptually illustrates a third exemplary embodiment of a light activated, silicon controlled switch.

FIG. 3 conceptually illustrate a third exemplary embodiment of a light activated, silicon controlled switch 300. The third exemplary embodiment of the switch 300 may represent an alternate top-down view of the second exemplary embodiment of the switch 200 shown in FIG. 2. However, in the interest of clarity some elements shown in FIG. 2 are not depicted in the FIG. 3. Furthermore, persons of ordinary skill in the art having benefit of the present disclosure should appreciate that the third exemplary embodiment of the switch 300 may include additional elements, such as contacts, openings, and the like, but are not depicted in FIG. 3.

The switch 300 includes a silicon diode and a thyristor that are separated by a trench 305. The silicon diode is formed in an n-type region 310. The silicon diode also includes a p-type region 315 and an n-type region 320 (or sinker) that is more highly doped than the n-type region 310. The thyristor includes a p-doped sinker 325 that is used to contact an anode region 330 in the thyristor. In the illustrated embodiment, the anode region 330 is a p-type region (which may also be referred to as a tub or a well) that may be formed using known implantation and/or epitaxy techniques. An epitaxial (EPI) region (not shown in FIG. 3) may also be formed within the anode region 330. In the illustrated embodiment, the EPI region is an n-type region that may be formed using known epitaxy techniques. The thyristor also includes a base region 335 that is a p-type region that is foreign within the EPI region using known techniques.

A primary portion of the thyristor includes n-type regions 340 that are formed in the base region 335. The primary portion may also include one or more cathode short 345 that are p-type regions formed in the base region 335. The thyristor also includes an amplifying gate that includes a p-type region 350 and an n-type region 355. An additional thyristor element (referred to herein as a turn on thyristor or SCR) may be formed in the base region 335 by implanting an n-type region 360 in the base region 335.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

What is claimed:

1. An optically triggered switch, comprising:
   a silicon layer having at least one trench formed therein;
   at least one silicon diode formed in the silicon layer; and
   a first thyristor formed in the silicon layer, the first thyristor being physically and electrically isolated from said at least one silicon diode by said at least one trench, and the first thyristor being configured to turn on in response to electromagnetic radiation generated by said at least one silicon diode.

2. The optically triggered switch set forth in claim 1, wherein the first thyristor comprises:
   a first p-type region formed in the silicon layer;
   a first n-type region formed within the first p-type region;
   a second p-type region formed within the first n-type region; and
   at least one second n-type region formed within the second p-type region.

3. The optically triggered switch set forth in claim 2, wherein the first thyristor comprises:
   an anode in contact with the first p-type region; and
   a cathode in contact with said at least one second n-type region.

4. The optically triggered switch set forth in claim 3, comprising a second thyristor including a third n-type region formed within the second p-type region, the third n-type region being formed such that the electromagnetic radiation generated by said at least one silicon diode turns on the second thyristor.

5. The optically triggered switch set forth in claim 4, comprising:
   an amplifying gate comprising a fourth n-type region formed in the second p-type region; and
   a third p-type region coupled to the amplifying gate.

6. The optically triggered switch set forth in claim 5, wherein a first current is generated in the first n-type region and the second p-type region by the electromagnetic radiation, and wherein the first current creates a first voltage drop that forward biases the second thyristor.

7. The optically triggered switch set forth in claim 6, wherein the second thyristor forms a second current when the second thyristor is turned on.

8. The optically triggered switch set forth in claim 7, wherein the second current creates a second voltage drop that forward biases the third thyristor.

9. The optically triggered switch set forth in claim 8, wherein an emitter in the first thyristor injects electrons in response to a forward bias of the emitter.

10. The optically triggered switch set forth in claim 9, wherein the first thyristor turns on in response to the third current exceeding a latching current of the first thyristor.

* * * * *